(12) United States Patent
Cho et al.

(10) Patent No.: US 10,379,983 B2
(45) Date of Patent: Aug. 13, 2019

(54) SIMULATION DEVICE AND DISTRIBUTION SIMULATION SYSTEM

(71) Applicant: SAMSUNG ELECTRONICS CO., LTD., Suwon-si (KR)

(72) Inventors: Young-Chul Cho, Yongin-si (KR); Seong-Hoon Jeong, Seoul (KR); Jin-Sae Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 381 days.

(21) Appl. No.: 14/980,903

(22) Filed: Dec. 28, 2015

(65) Prior Publication Data
US 2016/0132414 A1 May 12, 2016

Related U.S. Application Data

(63) Continuation of application No. PCT/KR2014/005134, filed on Jun. 11, 2014.

(30) Foreign Application Priority Data

Jun. 28, 2013 (KR) ........................ 10-2013-0075916

(51) Int. Cl.
*G06F 9/44* (2018.01)
*G06F 13/10* (2006.01)
*G06F 13/12* (2006.01)
*G06F 11/26* (2006.01)
*G06F 11/263* (2006.01)
*G06F 17/50* (2006.01)

(52) U.S. Cl.
CPC .......... *G06F 11/261* (2013.01); *G06F 11/263* (2013.01); *G06F 17/5009* (2013.01)

(58) Field of Classification Search
None
See application file for complete search history.

(56) References Cited

U.S. PATENT DOCUMENTS 5,999,734 A 12/1999 Willis et al.
7,231,334 B2 6/2007 Mellors et al.
(Continued)

FOREIGN PATENT DOCUMENTS

JP 11-238042 A 8/1999
JP 11-272621 A 10/1999
(Continued)

OTHER PUBLICATIONS

Petersen, Charles G. et al., "A Comparison of Picking, Storage, and Routing Policies in Manual Order Picking", Sep. 1, 2003, Int. J. Production Economics 92, Elsevier B.V. (Year: 2003).*

(Continued)

*Primary Examiner* — Cedric Johnson
(74) *Attorney, Agent, or Firm* — NSIP Law

(57) ABSTRACT

A simulation apparatus and a distribution simulation system are disclosed. The simulation apparatus, according to one example, includes a simulation executer configured to execute a simulation task, a data storage configured to store data related to the simulation task based on a data storage policy that is set in advance of the execution of the simulation tasks, and a data updater configured to update the data stored in the data storage to most recent data by comparing the data stored in the data storage with data stored in another simulation apparatus.

19 Claims, 4 Drawing Sheets

(56) References Cited

U.S. PATENT DOCUMENTS

| | | | |
|---|---|---|---|
| 7,536,291 B1* | 5/2009 | Vijayan Retnamma | ..................... G06F 3/0619 703/21 |
| 8,069,021 B2 | 11/2011 | Sturrock et al. | |
| 8,688,630 B2 | 4/2014 | Bernbo et al. | |
| 2011/0072412 A1* | 3/2011 | Hasslen | .............. G06F 17/5022 717/106 |
| 2011/0196664 A1* | 8/2011 | Zunger | ............. G06F 17/30215 703/21 |
| 2012/0226484 A1 | 9/2012 | Nam et al. | |
| 2014/0047342 A1* | 2/2014 | Breternitz | ............. G06F 9/5061 715/735 |

FOREIGN PATENT DOCUMENTS

| | | | |
|---|---|---|---|
| JP | 11272621 A | * | 10/1999 |
| JP | 2008-27225 A | | 2/2008 |
| JP | 2011-154522 A | | 8/2011 |
| JP | 2011154522 A | * | 8/2011 |
| KR | 10-2010-0118357 A | | 11/2010 |
| KR | 10-2011-0057543 A | | 6/2011 |
| KR | 10-2011-0086114 A | | 7/2011 |
| KR | 10-2012-0052660 A | | 5/2012 |
| KR | 10-2012-0064547 A | | 6/2012 |
| KR | 10-2012-0133857 A | | 12/2012 |

OTHER PUBLICATIONS

International Search Report dated Sep. 30, 2014 in counterpart International Application No. PCT/KR2014/005134 (5 pages, with English translation).

Korean Office Action dated Jun. 19, 2019 in counterpart Korean Patent Application No. 10-2013-0075916 (11 pages, in Korean with English translation).

* cited by examiner

FIG. 3

| DATA TYPE | DATA STORING POLICY |
|---|---|
| DUT DATA | CACHE LOCK |
| SIMULATION INPUT DATA | CACHING |
| INTERMEDIATE DATA | NO WRITE-BACK |
| SIMULATION RESULT DATA | WRITE-THROUGH / WRITE-BACK |

SIMULATION DEVICE AND DISTRIBUTION SIMULATION SYSTEM

CROSS-REFERENCE TO RELATED APPLICATION(S)

This application is a continuation bypass U.S. national stage application of International Application No. PCT/KR2014/005134 filed on Jun. 11, 2014, which claims the benefit of Korean Patent Application No. 10-2013-0075916 filed on Jun. 28, 2013, in the Korean Intellectual Property Office, the entire disclosures of which are incorporated herein by reference for all purposes.

BACKGROUND

1. Field

The following description relates to a distributed simulation technology. The following description also relates to a simulation apparatus and a distributed simulation system.

2. Description of Related Art

System simulation for analysis of a structure and performance is useful for the manufacture of systems of smartphones, TVs, and other electronic appliances. Such a simulation enables a system to achieve desirable performance without errors, and to be configured as an optimized system. That is, a simulation technique that measures performance in advance of actual use, and is thus able to predict a system's performance accurately, has been used in analyzing and estimating a system, which is a useful part of the design process.

However, in a distributed simulation environment, where a plurality of simulation apparatuses share one storage, each simulation apparatus repeatedly receives simulation data from the storage, such as by executing simulation tasks, and transferring, and storing the execution result in the storage. In such a use case, which involves repeating and executing many tests for a long time, as in a regression test, where each individual test uses a large amount of storage, the more tasks the simulation apparatus executes in parallel, the more often a bottleneck phenomenon for a storage access may occur. Such a bottleneck occurs where one task has to wait for another task to reach a certain point in its execution before the first task is able to proceed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A simulation apparatus and a distributed simulation system are provided.

In one general aspect, a simulation apparatus of a distributed simulation system in which simulation apparatuses share one storage node includes a simulation executer configured to execute simulation tasks, a data storage configured to store data related to the simulation tasks based on a data storing policy that is set in advance of the execution of the simulation tasks, and a data updater configured to compare data stored in the data storage with data stored in another simulation apparatus, and update the data stored in the data storage into most recent data.

The data related to the simulation tasks may include at least one of Design Under Test (DUT) data, simulation input data, data generated in a simulation process, or simulation result data.

Prior to executing the simulation tasks, the simulation executer may receive data used for executing the simulation tasks from the storage node only once, store the data in the data storage, and execute the simulation tasks by using the data stored in the data storage depending on simulation requirements.

The data used for executing the simulation tasks may include at least one of Design Under Test (DUT) data or simulation input data.

The data storage may be implemented using at least one of Hard Disk Drive (HDD), Solid State Drive (SSD), Dynamic Random Access Memory (DRAM), Static Random Access Memory (SRAM), Ferroelectric Random Access Memory (FRAM), or flash memory storage.

In another general aspect, a distributed simulation system includes simulation nodes configured to execute simulation tasks allocated thereto, a storage node configured to store data needed for executing the simulation tasks, and data storages, each configured to be allocated to one of the simulation nodes, and to store data related to the simulation tasks depending on a data storing policy that is set in advance of the execution of the simulation tasks, wherein each simulation node has a data storage allocated to that simulation node.

The data used for executing the simulation tasks may include at least one of Design Under Test (DUT) data or simulation input data.

The data related to the simulation tasks may include at least one of Design Under Test (DUT) data, simulation input data, data generated in a simulation process, or simulation result data.

Each simulation node may receive data used for executing the simulation tasks from the storage node only once, store the data in its allocated data storage, and execute the simulation tasks by using the data stored in its allocated data storage depending on simulation requirements, prior to executing the simulation tasks allocated to it.

Each data storage may be implemented using at least one among Hard Disk Drive (HDD), Solid State Drive (SSD), Dynamic Random Access Memory (DRAM), Static Random Access Memory (SRAM), Ferroelectric Random Access Memory (FRAM), or flash memory storage.

The distributed simulation system may further include a data updater configured to update data stored in each of the data storages based on a most recent data stored in one of the data storages.

A file system of the storage node may include one among Andrew File System (AFS), OpenAFS, Apple Filing Protocol (AFP), Distributed File System (DFS), GlusterFS, General Parallel File System (GPFS), Lustre, NetWare Core Protocol (NCP), Network File System (NFS), Parallel Optimized Host Message Exchange Layered File System (POHMELFS), Hadoop, or Secure Shell Filesystem (SSHFS).

The distributed simulation system may further include a management node configured to, in response to receiving a simulation executing request, allocate the simulation tasks to each simulation node based on at least one of an overall computation quantity, a load of each simulation node, a computation power of each simulation node, or a computation bandwidth.

The management node and each simulation node may execute communications between each other using a TCP/IP protocol.

In another general aspect, a simulation method of a simulation apparatus of a distributed simulation system in which simulation apparatuses share one storage node includes executing simulation tasks, using a simulation executer, storing data related to the simulation tasks based on a data storing policy that is set in advance of the execution of the simulation tasks, using a data storage, and comparing data stored in the data storage with data stored in another simulation apparatus, and updating the data stored in the data storage into most recent data, using a data updater.

The data related to the simulation tasks may include at least one of Design Under Test (DUT) data, simulation input data, data generated in a simulation process, or simulation result data.

Prior to executing the simulation tasks, the simulation executer may receive data used for executing the simulation tasks from the storage node only once, store the data in the data storage, and execute the simulation tasks by using the data stored in the data storage depending on simulation requirements.

The data used for executing the simulation tasks may include at least one of Design Under Test (DUT) data or simulation input data.

The data storage may be implemented using at least one of Hard Disk Drive (HDD), Solid State Drive (SSD), Dynamic Random Access Memory (DRAM), Static Random Access Memory (SRAM), Ferroelectric Random Access Memory (FRAM), or flash memory storage.

Other features and aspects will be apparent from the following detailed description, the drawings, and the claims.

BRIEF DESCRIPTION OF THE DRAWINGS

FIG. 3 is a diagram illustrating an example of a data storing policy of data storage 230 of FIG. 2.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

A node described in the following description refers to a computing device that is able to execute transferring and receiving of data through a wired or wireless network, processing and storing such data, and so on. In various examples, the node includes a processor for processing data, a mobile terminal device, portable digital devices such as a Portable DVD Player or Portable Media Player, and similar devices, a personal computer, such as a laptop, desktop, tablet, convertible computer, or similar devices, a workstation, a supercomputer, a server computer, and so on.

Figure 1:
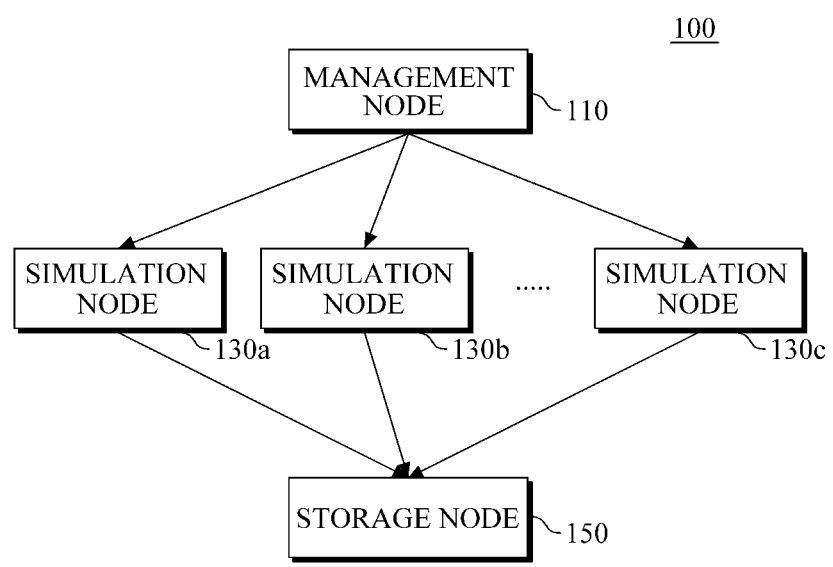
FIG. 1 is a diagram illustrating an example of a distributed simulation system.

FIG. 1 is a diagram illustrating an example of a distributed simulation system.

Referring to the example of FIG. 1, an example of a distributed simulation system 100 includes a management node 110, one or more simulation nodes 130a, 130b, and 130c, and a storage node 150.

For example, the management node 110 manages overall simulation tasks, divides the overall simulation tasks into a plurality of simulation tasks, and allocates the plurality of the simulation tasks to simulation nodes 130a, 130b, and 130c. In this example, overall simulation tasks are tasks that pertain to the simulation as a whole, and are divided into simulation tasks that are executed by an individual simulation node for actual execution.

For example, if there is a user's simulation task execution request, the management node 110 checks a load of each of simulation nodes 130a, 130b, and 130c, and predicts an overall computation quantity, a computation power of each simulation node, and a computation bandwidth, and so on. Based on these predictions, the management node 110 is able to properly divide and allocate the overall simulation tasks to each of the simulation nodes 130a, 130b, and 130c. In this example, when the management node 110 allocates the simulation tasks to each of the simulation nodes 130a, 130b, and 130c, items, such as the overall computation quantity, the individual loads of each of the simulation nodes 130a, 130b, and 130c, the computation power, the computation bandwidth, and so on, are considered. However, the factors included in the consideration is not limited to the items above, and other various items are considered in other example depending on the system performance or function, or goals for system performance and function.

In this example, a storage node 150 stores data, simulation result data, and the like, for the simulation tasks. Here, the data for the simulation tasks, in various examples, includes Design Under Test (DUT) data, simulation input data, and so on.

Meanwhile, in various examples, a file system of the storage node 150 may be implemented with Andrew File System (AFS), OpenAFS, Apple Filing Protocol (AFP), Distributed File System (DFS), GlusterFS, General Parallel File System (GPFS), Lustre, NetWare Core Protocol (NCP), Network File System (NFS), Parallel Optimized Host Message Exchange Layered File System (POHMELFS), Hadoop, Secure Shell Filesystem (SSHFS), and other appropriate distributed file systems. However, file systems are not limited to the particular examples listed above. Hence, in various examples, the storage node 150 is implemented using various file systems to store and manage the data.

For example, the simulation nodes 130a, 130b, and 130c execute the simulation tasks that are allocated to them. To execute the simulation tasks allocated to them, the simulation nodes 130a, 130b, and 130c approach the storage node 150, receive data used for executing the simulation tasks, and based on the received data, execute the simulation tasks. For example, if the simulation nodes 130a, 130b, and 130c are allocated the simulation tasks from the management node 110, the simulation nodes 130a, 130b, and 130c access the storage node 150 first only once before executing the simulation tasks, receive data, for example, Design Under Test (DUT) data, and simulation input data, and so on, which is needed for executing the simulation tasks. Based on the received data, the simulation nodes 130a, 130b, and 130c, execute the allocated simulation tasks.

When the simulation tasks allocated to the simulation nodes 130a, 130b, and 130c are completed, the simulation nodes 130a, 130b, and 130c store simulation result data in the storage node 150.

However, the management node 110 and each of the simulation nodes 130a, 130b, and 130c executes communications between each other. In an example, communication between the nodes uses the TCP/IP protocol. However, a TCP/IP protocol is only one example of a communication protocol, and other various communication protocols are used in other examples.

Hereinafter, the simulation node is described in further detail.

Figure 2:
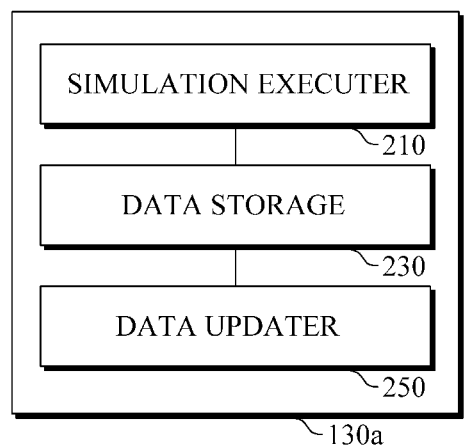
FIG. 2 is a detailed diagram illustrating an example of a simulation node 130a of FIG. 1

FIG. 2 is a detailed diagram illustrating an example of a simulation node 130a of FIG. 1.

Referring to the example of FIG. 2, a simulation node 130a includes a simulation executer 210, a data storage 230, and a data updater 250.

For example, a simulation executer 210 executes simulation tasks allocated from a management node 110. For example, the simulation executer 210 receives data, for example, Design Under Test (DUT) data, and simulation input data, and so on, which is needed for executing the simulation tasks, from a storage node 150, and executes the allocated simulation tasks. In this example, in order to receive the data used for executing the simulation tasks, the simulation executer 210 accesses a storage node 150 only one time before executing the simulation tasks.

In such an example, data storage 230 store data that is related to the simulation tasks that the simulation executer 210 executes, based on a data storing policy that is set in advance. Thus, in this example, the data related to the simulation tasks includes the data needed for executing the simulation tasks received from the storage node 150, intermediate data generated during a process of executing the simulation tasks, simulation result data, and so on.

In various examples, the data storage 230 is implemented as a Hard Disk Drive (HDD), Solid State Drive (SSD), Dynamic Random Access Memory (DRAM), Static Random Access Memory (SRAM), Ferroelectric Random Access Memory (FRAM), flash memory, and other similar storage devices. However, the data storage 230 is not limited to these devices, and is also implemented using other various devices to store data in other examples.

A data storage policy of the data storage 230 is described further later with reference to FIG. 3.

A data updater 250 compares the data related to the simulation tasks stored in the data storage 230 with other data related to simulation tasks stored in other simulation nodes 130b and 130c. The data updater 250 also updates, to the latest data, the data related to the simulation tasks stored in the data storage 230. For example, if it is assumed that three simulation nodes, such as simulation node 1, simulation node 2, and simulation node 3, execute simulation in parallel, and data stored in the simulation node 3 is the most recent data, each data updater of the simulation nodes 1 and 2 also receive and update the data stored in the simulation node 3 so as to enable the simulation nodes 1 and 2 to have the most recent data.

In addition, in various examples, the data storage 230 or the data updater 250 is implemented using additional external devices outside of the simulation node 130a. Alternatively put, in such an example, the simulation node 130a includes the simulation executer 210 and the data storage 230. Also, in this example, the data updater 250 is implemented outside of the simulation node 130a, the simulation node 130a includes the simulation executer 210, and the data storage 230 and the data updater 250 are implemented outside of the simulation node 130a.

FIG. 3 is a diagram illustrating an example of a data storing policy of data storage 230 of FIG. 2.

Referring to the example of FIG. 3, data stored in data storage 230, is classified into DUT data, simulation input data, intermediate data, and simulation result data. FIG. 3 indicates a data storing policy for each of these types of data.

The DUT data is repeatedly used when executing repeated simulation tasks. Hence, the DUT data has as its data storing policy a cache locking policy that does not allow another node to remove data once the data is stored in the data storage 230.

The simulation input data is no longer used once the simulation task is executed, so the simulation input data has as its data storing policy a caching policy that enables data to be temporarily stored in the data storage 230 as cached data.

The intermediate data is generated while executing the simulation task, and only used during a period the simulation task is executed. So, because the intermediate data becomes useless after the simulation task is completed, the intermediate data has as its data storing policy that provides that it is temporarily stored in the data storage 230 and is deleted after the simulation task is finished. Alternatively put, the intermediate data has a no write-back policy that does not write back to the storage node 150.

The simulation result data is used to store data in a database, is used to analyze the data, or is needed for another simulation task after one simulation task is finished. So, the simulation result data has as its data storing policy a write-though or write-back policy that enables data to be written-through or written-back. Such a policy is managed manually by a user or automatically depending on traffic between the simulation node and the storage node.

If the simulation node 130a requires the use of simulation result data of another simulation node 130b or 130c when executing the allocated simulation tasks, the data updater 250 receives and stores the simulation result data of the other simulation node 130b or 130c in the data storage 230. By performing these operations, the simulation node 130a is capable of executing the simulation tasks allocated thereto without accessing to the storage node 150, because it ensures that data is updated between the simulation nodes without directly involving the storage node 150.

Figure 4:
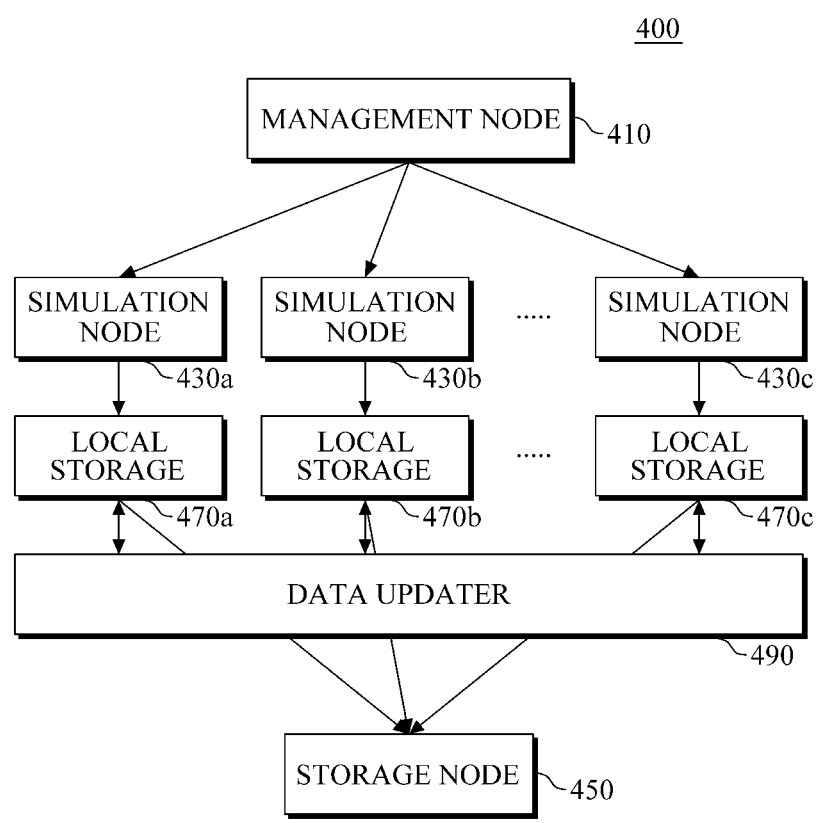
FIG. 4 is a diagram illustrating an example of a distributed simulation system.

FIG. 4 is a diagram illustrating an example of a distributed simulation system.

Referring to the example of FIG. 4, an example of a distributed simulation system 400 includes a management node 410, simulation nodes 430a, 430b, and 430c, a storage node 450, local storages 470a, 470b, and 470c, and a data updater 490. In the example of FIG. 4, the management 410 and the storage node 450 have a corresponding composition and a corresponding function to those illustrated in FIG. 1. Hence, a detailed description is omitted for brevity.

Comparing FIGS. 1, 2, and 4 to each other, in the distributed simulation system 400 illustrated in the example of FIG. 4, it is understood that the data storage 230 and the data updater 250 of FIG. 2 are implemented as a separate device outside of the simulation node itself.

Each data storage of data storages 470a, 470b, and 470c is connected to each of the simulation nodes 430a, 430b, and 430c, respectively, and is a local storage associated with each of the simulation nodes 430a, 430b, and 430c, and a detailed functionality of each of the data storages 470a, 470b, and 470c corresponds to the data storage 230 as illustrated in the example of FIG. 2. Also, the data updater 490 of FIG. 4 is a corresponding structural element corresponding to the data updater 250 of FIG. 2. When configured as an independent device outside of the simulation node, the data updater 490 is implemented as one of the elements of the simulation system. In such an example, the data updater 490 manages data updating for all of the data storages 470a, 470b, and 470c in the distributed simulation system 400.

For example, the data updater 490 is connected to the data storages 470a, 470b, and 470c. Further the data updater 490 compares each of the data stored in each of the data storages 470a, 470b, and 470c, updates the data stored in each of the data storages 470a, 470b, and 470c into the most recent data, and enables the data storages 470a, 470b, and 470c to keep the most recent data.

For example, the management node 410, and each of the simulation nodes 430a, 430b, and 430c executes communications between each other using a TCP/IP protocol. However, use is not limited to the TCP/IP protocol, as it is just one example protocol. Thus, the management node 410 and the simulation nodes 130a, 130b, and 130c use various communication protocols.

The apparatuses, units, modules, devices, and other components illustrated in FIGS. 1-4 that perform the operations described herein with respect to FIGS. 1-4 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-4. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-4 that perform the operations described herein with respect to FIGS. 1-4 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

As a non-exhaustive example only, a terminal/device/unit as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A simulation apparatus of a distributed simulation system comprising simulation apparatuses that share a central data storage, the simulation apparatus comprising:
   a processor comprising
      a simulation executer configured to execute a simulation task in response to being assigned the simulation task by a central management node,
      wherein, upon being assigned the simulation task, the simulation executer is further configured to access the central data storage to retrieve data required to perform the simulation task and perform the simulation task using the retrieved data; and
   a local data storage configured to store data related to the simulation task, including the data required to perform the simulation task and simulation result data generated as a result of the performing of the simulation task, based on a data storing policy that is set in advance of the execution of the simulation task,
   wherein the processor further comprises a data updater configured to compare data stored in the local data storage with data stored in a remote local data storage of a remote simulation apparatus, and update the data stored in the local data storage into most recent data based on the comparison for a subsequent simulation executed by the simulation executer.

2. The simulation apparatus of claim 1, wherein the data related to the simulation task comprises types of data comprising Design Under Test (DUT) data, simulation input data, intermediate data generated during execution of the simulation task, and the simulation result data.

3. The simulation apparatus of claim 2, wherein the data storage policy comprises data indicating any one or any combination of any two or more of storage, removal, expiration, or editing rules for each type of the data related to the simulation task that is stored in the local data storage.

4. The simulation apparatus of claim 3, wherein:
   the DUT data comprises first data used in execution of repeated simulation tasks, and the data storage policy comprises first policy data indicating caching and removal rules of the DUT data;
   the simulation input data comprises second data that expires in response to the simulation task being completed, and the data storage policy comprises second policy data indicating caching and expiration rules of the simulation input data;
   the intermediate data comprises third data used only during the execution of the simulation task, and the data storage policy comprises third policy data indicating expiration and removal rules of the intermediate data; and
   the simulation result data comprises fourth data generated in response to the simulation task being completed and further either used to analyze additional data or used to perform a second simulation task, and the data storage policy comprises fourth policy data indicating storage and editing rules of the simulation result data.

5. The simulation apparatus of claim 1, wherein, prior to executing the simulation task, the simulation executer is further configured to access the central data storage a single time to retrieve the data required to perform the simulation task, store the retrieved data in the local data storage, and execute the simulation task by using the stored data, based on simulation requirements of the simulation task.

6. The simulation apparatus of claim 5, wherein the retrieved data comprises either one or both of Design Under Test (DUT) data or simulation input data.

7. The simulation apparatus of claim 1, wherein the local data storage is implemented using any one or any combination of any two or more of a Hard Disk Drive (HDD), Solid State Drive (SSD), Dynamic Random Access Memory (DRAM), Static Random Access Memory (SRAM), Ferroelectric Random Access Memory (FRAM), or flash memory storage.

8. A distributed simulation system, comprising:
   simulation nodes comprising respective processors, each simulation node configured to execute respective simulation tasks allocated respectively thereto;
   a central data storage configured to store data needed for executing the respective simulation tasks;
   local data storages, each configured to be respectively allocated to one of the simulation nodes, and to store data related to the respective simulation tasks, including data required to perform the respective simulation tasks and simulation result data generated by respective simulation nodes for executing the respective simulation tasks, depending on a data storing policy that is set in advance of the execution of the simulation tasks, wherein each simulation node has a local data storage allocated to that simulation node; and
   a data updater configured to update data stored in each of the local data storages based on a most recent data stored in one of the local data storages for subsequent executions of the simulation tasks by the simulation nodes.

9. The distributed simulation system of claim 8, wherein the data required to execute the respective simulation tasks comprises either one or both of Design Under Test (DUT) data or simulation input data.

10. The distributed simulation system of claim 8, wherein the data related to the respective simulation tasks comprises types of data comprising Design Under Test (DUT) data, simulation input data, intermediate data generated during execution of the respective simulation tasks, and the simulation result data.

11. The distributed simulation system of claim 8, wherein, prior to executing the respective allocated simulation tasks, each simulation node accesses the central data storage a single time and receives the data required to execute the simulation tasks from the central data storage, stores the data in its respective allocated local data storage, and executes the respective simulation tasks by using the stored data, based on simulation requirements of the respective simulation tasks.

12. The distributed simulation system of claim 8, wherein each local data storage is implemented using any one or any combination of any two or more of a Hard Disk Drive (HDD), Solid State Drive (SSD), Dynamic Random Access Memory (DRAM), Static Random Access Memory (SRAM), Ferroelectric Random Access Memory (FRAM), or flash memory storage.

13. The distributed simulation system of claim 8, wherein a file system of the central data storage comprises one among Andrew File System (AFS), OpenAFS, Apple Filing Protocol (AFP), Distributed File System (DFS), GlusterFS, General Parallel File System (GPFS), Lustre, NetWare Core Protocol (NCP), Network File System (NFS), Parallel Optimized Host Message Exchange Layered File System (POHMELFS), Hadoop, or Secure Shell Filesystem (SSHFS).

14. The distributed simulation system of claim 8, further comprising:
a central management node comprising a processor and configured to, in response to receiving a simulation executing request, respectively allocate the simulation tasks to each simulation node based on any one or any combination of any two or more of an overall computation quantity, a load of each simulation node, a computation power of each simulation node, or a computation bandwidth.

15. The distributed simulation system of claim 14, wherein the central management node and each simulation node execute communications between each other using a TCP/IP protocol.

16. A simulation method of a simulation apparatus of a distributed simulation system comprising simulation apparatuses that share one central data storage, the simulation method comprising:
executing, by a simulation executor, a simulation task in response to being assigned the simulation task by a central management node;
upon being assigned the simulation task, accessing, by the simulation executer, the central data storage to retrieve data required to perform the simulation task;
storing, by a local data storage, data related to the simulation task, including the data required to perform the simulation task and simulation result data generated as a result of the simulation task, based on a data storing policy that is set in advance of the execution of the simulation task;
comparing, by a data updater, data stored in the local data storage with data stored in a remote local storage of a remote simulation apparatus; and
updating, by the data updater, the data stored in the local data storage into most recent data based on the comparing for a subsequent simulation executed by the simulation executer.

17. The simulation method of claim 16, wherein the data related to the simulation task comprises types of data comprising Design Under Test (DUT) data, simulation input data, intermediate data generated during execution of the simulation task, and the simulation result data.

18. The simulation method of claim 16, further comprising:
prior to executing the simulation task, accessing the central data storage a single time and receiving data required to execute the simulation task from the central data storage,
storing the retrieved data in the local data storage, and
executing the simulation task by using the stored data, based on simulation requirements of the simulation task.

19. The simulation method of claim 18, wherein the data required to perform the simulation task comprises either one or both of Design Under Test (DUT) data or simulation input data.

* * * * *